(12) United States Patent
Schrödinger

(10) Patent No.: US 6,943,505 B2
(45) Date of Patent: Sep. 13, 2005

(54) DRIVING DEVICE FOR A LIGHT-EMITTING COMPONENT AND A METHOD FOR DRIVING A LIGHT-EMITTING COMPONENT

(75) Inventor: Karl Schrödinger, Berlin (DE)

(73) Assignee: Infineon Technologies AG, Munich (DE)

(*) Notice: Subject to any disclaimer, the term of this patent is extended or adjusted under 35 U.S.C. 154(b) by 27 days.

(21) Appl. No.: 10/454,918

(22) Filed: Jun. 5, 2003

(65) Prior Publication Data

US 2004/0245941 A1 Dec. 9, 2004

(51) Int. Cl.[7] .............................. H01S 3/10; H01S 3/102
(52) U.S. Cl. ........................... 315/291; 372/31; 372/38; 372/32; 372/29
(58) Field of Search ................................. 341/141, 156, 341/159, 155, 164, 165, 158, 142; 315/291, 309, 149; 372/38, 31, 9, 29, 34, 32, 33, 35

(56) References Cited

U.S. PATENT DOCUMENTS

| | | | | |
|---|---|---|---|---|
| 5,019,769 A | * | 5/1991 | Levinson | 372/31 |
| 5,118,964 A | * | 6/1992 | McArdle | 307/117 |
| 5,736,948 A | * | 4/1998 | Mitsuishi et al. | 341/141 |
| 5,844,928 A | * | 12/1998 | Shastri et al. | 372/38.02 |
| 5,908,455 A | * | 6/1999 | Parvahan | 701/29 |
| 5,974,064 A | * | 10/1999 | Uchida | 372/38.02 |
| 6,242,870 B1 | * | 6/2001 | Koyanagi et al. | 315/291 |
| 6,518,880 B2 | * | 2/2003 | Tanizawa | 340/514 |
| 6,643,301 B2 | * | 11/2003 | Schrodinger et al. | 372/29.011 |
| 2004/0179451 A1 | * | 9/2004 | Morishima et al. | 369/59.11 |

* cited by examiner

Primary Examiner—Wilson Lee
Assistant Examiner—Chuc Tran
(74) Attorney, Agent, or Firm—Laurence A. Greenberg; Werner H. Stemer; Ralph E. Locher

(57) ABSTRACT

The invention pertains to a driving device, for a light-emitting component, which can be universally used and is user-friendly. The driving device for a light-emitting component, particularly for a laser, includes an interface device for inputting a control signal selecting an operating mode of the component. It further includes a control device connected to the interface device, which drives the component with a predetermined operating-mode and temperature-dependent bias current and/or a predetermined operating-mode and temperature-dependent modulation current depending on the operating mode selected and depending on the temperature present at the component or on a temperature proportional thereto.

22 Claims, 3 Drawing Sheets

DRIVING DEVICE FOR A LIGHT-EMITTING COMPONENT AND A METHOD FOR DRIVING A LIGHT-EMITTING COMPONENT

BACKGROUND OF THE INVENTION

Field of the Invention

The invention relates to a driving device for driving a light-emitting component, particularly a laser.

SUMMARY OF THE INVENTION

The invention is based on the object of specifying a driving device for a light-emitting component which, in particular, can be used universally and, at the same time, exhibits a high degree of user friendliness.

Accordingly, according to the invention, a driving device for a light-emitting component, particularly for a laser, comprising an interface device for inputting control signals is provided. The control signals are used for selecting an operating mode of the light-emitting component. A control device connected to the interface device selects, depending on the operating mode selected at the interface and depending on the temperature present at the component—or depending on a temperature proportional to the component temperature, a corresponding or matching bias current value and/or modulation current value and applies to the light-emitting component a bias current and/or modulation current which corresponds to the selected bias current value or the selected modulation current value.

A significant advantage of the driving device according to the invention can be seen in the fact that it provides at least two different operating modes which can be selected by the user by applying corresponding control signals to the interface device. The driving device according to the invention can be used quite universally due to this possibility of selecting the operating mode.

A further essential advantage of the driving device according to the invention consists in that temperature changes which, as is known, can have a considerable influence on the characteristic of light-emitting components, are automatically taken into consideration by the driving device because the driving takes place both in dependence on the selected operating mode and in dependence on the prevailing temperature.

A temperature control can be effected in a particularly simple and thus advantageous manner if the driving device exhibits a temperature sensor by means of which the temperature of the light-emitting component or a temperature proportional thereto is measured.

For example, the temperature control can be effected "indirectly" in that the temperature drift of an amplifier circuit contained in the control device or the temperature characteristic of a thermally sensitive component—for example a temperature-dependent resistor—is used (as temperature sensor).

The driving device advantageously exhibits a storage device in which in each case a drive table is stored at least for two different operating modes of the light-emitting component, each of the drive tables in each case containing a bias current value and/or a modulation current value for at least two measured temperature values.

The storage device is preferably connected to the control device; the control device is then constructed, for example, in such a manner that it reads out the in each case associated bias current value and/or modulation current value, stored in the drive table, depending on the selected operating mode and depending on the measured temperature value of the temperature sensor, and drives the component with a bias current corresponding to the bias current value and/or a modulation current corresponding to the modulation current value.

According to an advantageous embodiment of the driving device according to the invention, it is provided that the temperature sensor is connected to the storage device and the measured temperature value of the temperature sensor is transferred from the temperature sensor to the storage device. The storage device is constructed in such a manner that it exclusively transfers to the control device those bias current values and/or modulation current values which correspond to the respective measured temperature value. In this embodiment of the storage device, the "temperature correction" in the drive to the light-emitting component is thus ensured on the side of the storage device. Thus, the control device can only read out the bias current values or modulation current values corresponding to the in each case prevailing temperature for the individual operating mode from the storage device.

In order to ensure that the driving device can be adapted to various operating modes in a particularly simple and thus advantageous manner, it is considered to be advantageous if the storage device exhibits a separate storage area for each drive table, particularly in each case a separate memory chip. Thus, the driving device can be adapted very simply to the operating modes desired in each case by changing storage areas or chips by addressing a suitable storage area or connecting a suitable memory chip to the storage device depending on the desired operating mode.

In addition, it is considered to be advantageous if the temperature sensor is in each case connected to each storage area or memory chip of the storage device. If the temperature sensor, for example, outputs a digital output signal as output signal, this digital output signal can be used directly or indirectly for determining the memory space or memory cell in which the bias current value or modulation current value, belonging to the respective temperature, for the light-emitting component is stored. In this case, therefore, the output signal of the temperature sensor directly specifies the associated memory location at which the desired information for driving the light-emitting component is stored.

Correspondingly, the storage areas or memory chips in each case preferably have a connection at which the output signal of the temperature sensor can determine the storage area which should be readable by the control device.

According to another advantageous development of the driving device according to the invention, it is provided that the control device is connected to the temperature sensor and the measured temperature value is transferred from the temperature sensor to the control device. In this embodiment of the invention, the control device, therefore, reads out the respective measured temperature value of the temperature sensor and then accesses, individually for each operating mode, the corresponding storage cells of the storage device in which the current values, that is to say modulation current value and/or bias current value matching the respective measured temperature value and the respective operating mode, are stored.

In a particularly simple and thus advantageous manner, a light-emitting component can be driven by means of the driving device if the control device comprises a D/A converter and a driver which is connected to the light-emitting component. The driver then drives the light-emitting component with a modulation current and/or a bias current which is predetermined by the D/A converter of the control device. The driver preferably contains an operational amplifier since operational amplifiers have a very high impedance at the input and have a very low current consumption. The D/A converter of the control device is preferably connected to an input of the operational amplifier.

To ensure that there are other possibilities for the user to influence the driving of the light-emitting component, it is considered to be advantageous if the other input of the operational amplifier is connected to the programmable resistor network which can be controlled by control signals and/or control bits. The electrical characteristic of the operational amplifier can then be adjusted or influenced by applying corresponding control signals or control bits to the programmable resistor network.

If, for example, it should be possible for the user to influence or correct the "feedback path" formed by a monitor diode of the light-emitting component, it is considered to be advantageous if the programmable resistor network is connected to a monitor diode of the light-emitting component.

The operational amplifier of the control device is preferably connected in such a manner that the D/A converter of the control device is connected to the negative input of the operational amplifier and the programmable resistor network is connected to the positive input of the operational amplifier.

The light-emitting component can be, for example, light-emitting diodes, edge-emitting lasers or surface-emitting lasers.

In addition, the invention is based on the object of specifying a method for driving a light-emitting component which can be used quite universally and is very user friendly.

With respect to the advantages of the method according to the invention and its advantageous embodiments, reference is made to the above statements in conjunction with the driving device according to the invention. To explain the invention,

DESCRIPTION OF THE PREFERRED EMBODIMENTS

Figure 1:
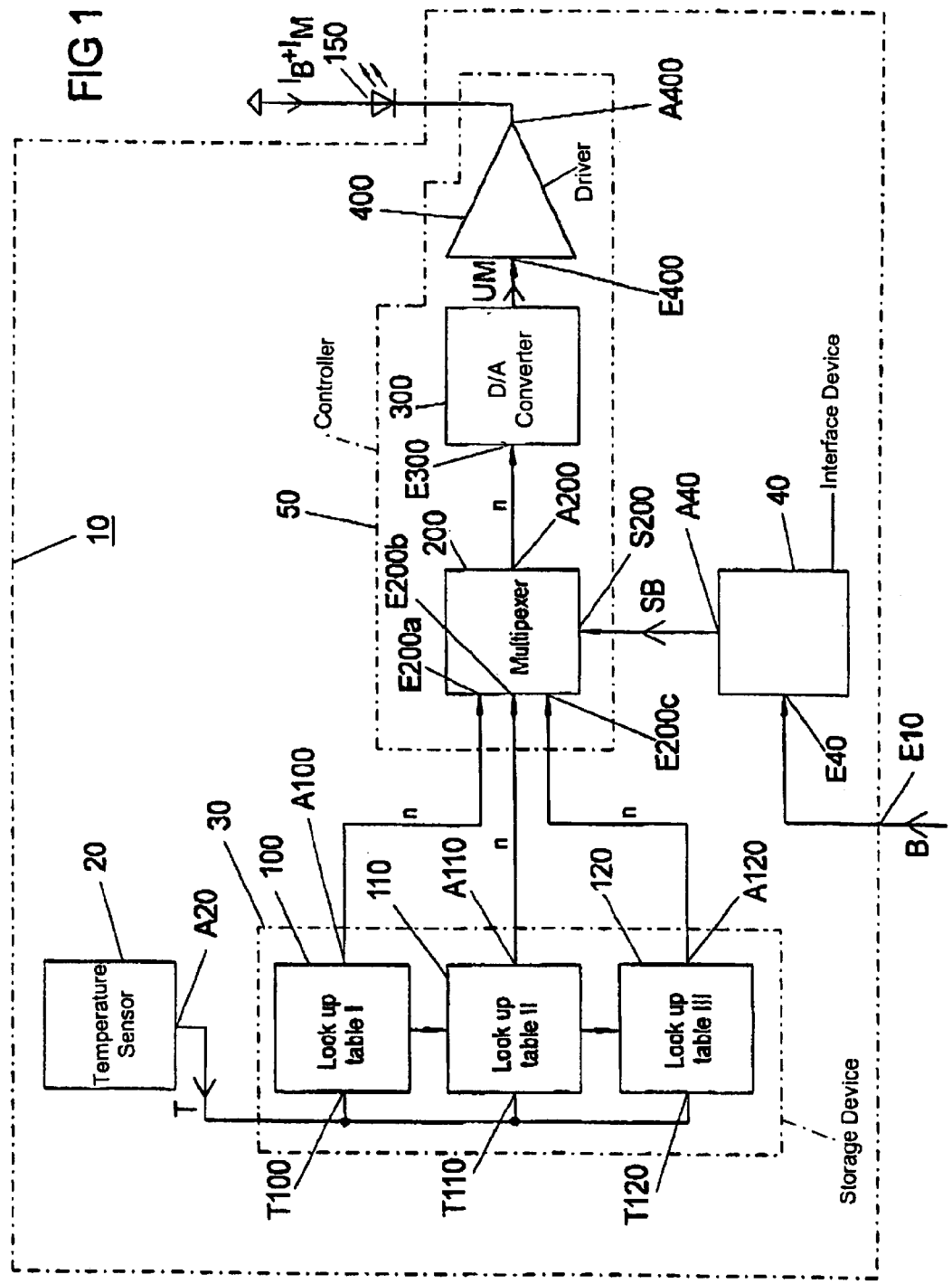
FIG. 1 shows a first exemplary embodiment of a driving device according to the invention by means of which the method according to the invention can also be carried out and FIG. 2 shows an exemplary embodiment of a driver for the driving device according to FIG. 1.

FIG. 1 shows a driving device 10 which comprises a temperature sensor 20, a storage device 30, an interface device 40 and a controller 50.

The storage device 30 has a first memory chip 100, a second memory chip 110 and a third memory chip 120. In each of the memory chips 100, 110 and 120, respectively, a drive table is in each case stored which specifies how a laser 200 connected to the drive device 10 is to be driven.

The memory chips 100, 110 and 120 in each case have a temperature input which is connected to an output A20 of the temperature sensor 20. The temperature inputs of the three memory chips 100, 110 and 120 bear the reference designations T100, T110 and T120, respectively, in FIG. 1.

The controller 50 has a multiplexer 200, the multiplexer inputs E200a, E200b and E200c of which are connected to outputs of the memory chips 100, 110 and 120. Actually, one input E200a of multiplexer 200 is connected to the output A100 of the memory chip 100. A further input E200b of multiplexer 200 is connected to an output A110 of memory chip 110. An additional input E200c of multiplexer 200 is preceded by an output A120 of memory chip 120.

In addition, the multiplexer 200 has a control input S200 which is connected to an output A40 of the interface device 40. The interface device 40 is formed by a controller, the input E40 of which forms the interface E10 of the driving device 10 to the outside. Applying corresponding control signals or control bits to input E40 of the interface device 40 allows control signals for driving the multiplexer 200 to be fed into the driving device 10.

An output A200 of multiplexer 200 is connected to an input E300 of a D/A (digital/analog) converter which is followed by an input E400 of a driver 400. The output A400 of the driver 400 is connected to the laser 150.

The driving device 10 according to FIG. 1 is operated as follows:

Firstly, a drive table which specifies how the laser 150 is to be driven in accordance with a first operating mode is stored in the first memory chip 100. The drive table contains in each case a bias current value $I_B$ and a modulation current value $I_M$ for at least two temperature values. The drive table advantageously exhibits not only current values for two temperature values but for a multiplicity of temperature values. The greater the number of temperature values stored in the drive table, the better the laser 150 can be controlled in the case of temperature changes.

A drive table is also stored in memory chip 110. This drive table, however, is provided for another operating mode than the drive table which is stored in the first memory chip 100. The drive table in the second memory chip 110 also contains bias current values $I_B$ and modulation current values $I_M$ which are in each case associated with temperature values. Thus, temperature-dependent drive parameters which can be used for driving the laser 150 can also be taken from the drive table of the second memory chip 110.

The third memory chip 120 correspondingly also contains a drive table in which bias current values $I_B$ and modulation current values $I_M$ are stored for various temperature values. The drive table of the third memory chip 120 refers to a third operating mode of the laser 150 which differs from the operating modes stored in the drive tables of the two memory chips 100 and 110.

When the driving device 10 is taken into operation, the temperature sensor 20 will output at its output A20 a temperature value which specifies the respective temperature of the laser 150 or a temperature proportional thereto. This temperature value T passes to the temperature inputs T100, T110 and T120 of the three memory chips 100, 110 and 120.

The memory chips 100, 110 and 120 are designed in such a manner that the temperature value T present at the respective temperature input T100, T110 and T120, respectively, directly specifies a storage area or a storage cell which can be read out at the output via outputs A100, A110 or A120, respectively.

If then an operating mode B is specified from the outside via the interface device 40, the interface device 40 generates an operating mode control signal SB specifying the respective operating mode. This operating mode control signal SB is transferred to the control input S200 of the multiplexer 200 which thereupon selects one of the three memory chips 100, 110 or 120, respectively. Thus, the respective memory chip is selected by the operating mode control signal SB.

As explained above, the memory chips 100, 110 and 120 in each case contain a drive table which has been predetermined for in each case one operating mode. If, for example, the operating mode control signal SB contains the information that the first operating mode has been selected, the multiplexer 200 will access memory chip 100 in which the drive table for the first operating mode is stored.

The multiplexer 200 will correspondingly access the second memory chip 110, the drive table of which contains the drive parameters for the second operating mode, if the second operating mode has been selected.

If the operating mode control signal SB specifies the third operating mode, the multiplexer 200 will address memory chip 120 in which the drive table and operating parameters for the third operating mode are stored.

In the text which follows, it is assumed that the first operating mode has been selected. The multiplexer 200 will, therefore, address or read out the first memory chip 100. It is only possible to read out the storage area which is predetermined by the measured temperature value T present at the temperature input T100. The multiplexer 200 will thus read out a bias current value $I_B$ and a modulation current value $I_M$ which corresponds to the first operating mode at the temperature T detected by the temperature sensor 20.

Multiplexer 200 forwards the current values $I_B$ and $I_M$ to the D/A converter 300 which generates an analog drive signal UM for the driver 400 from the digital current values $I_B$ and $I_M$. At output A400 of the driver 400, an output voltage or output potential is then provided which generates the desired bias current $I_B$ and the desired modulation current $I_M$ in the laser 150.

The multiplexer 200 will correspondingly access the drive table stored in the second memory chip 110 if the second operating mode is predetermined via the interface device 40.

If the third operating mode is required, the drive table in the third memory chip 120 is accessed.

Figure 2:
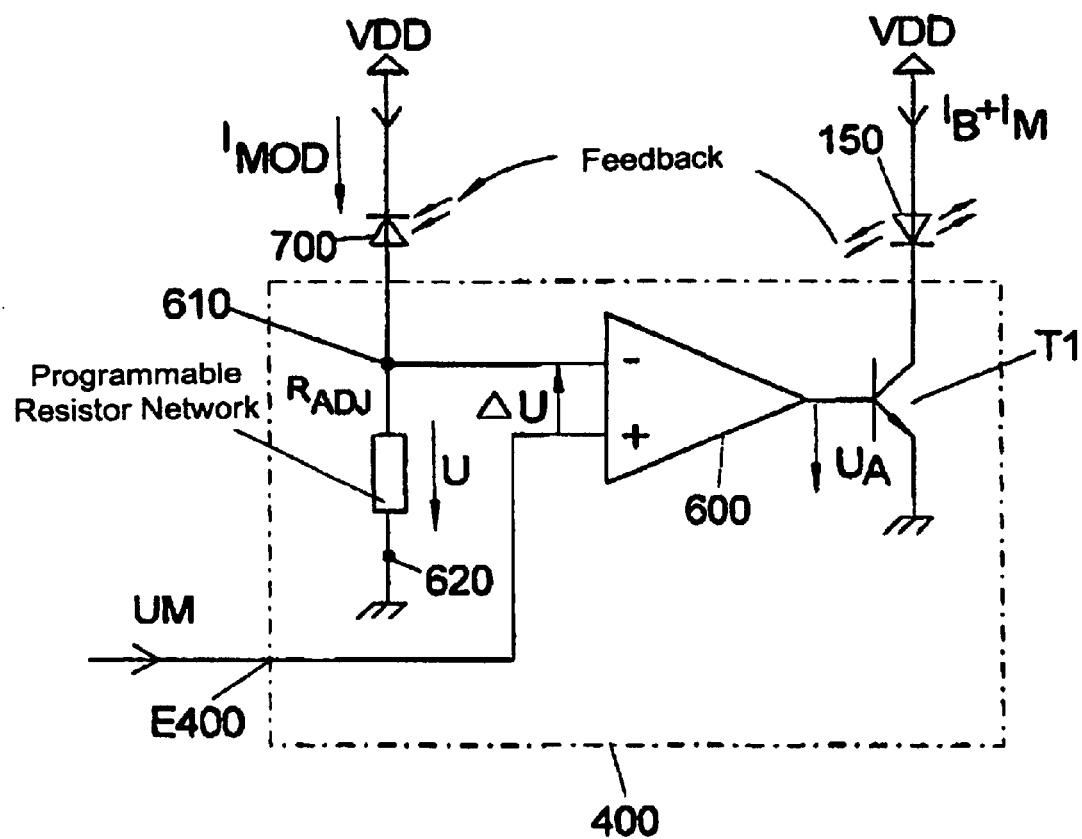

FIG. 2 shows an exemplary embodiment of the driver 400 according to FIG. 1.

It can be seen in FIG. 2 that input E400 of the driver 400 is formed by a positive input of an operational amplifier 600. The negative input of the operational amplifier 600 is connected to a terminal 610 of a programmable resistor network $R_{Adj}$, the other terminal 620 of which is connected to ground.

Moreover, the negative input of the operational amplifier 600 is connected to a monitor diode 700 of the laser 150, which is connected to the supply voltage $V_{DD}$. The monitor diode 700 generates a monitor current $I_{MCD}$ which flows to ground via the programmable resistor network $R_{Adj}$.

Depending on the voltage U dropped across the programmable resistor network $R_{Adj}$, a potential difference ΔU which is corrected to "0" by the operational amplifier occurs between the two inputs of the operational amplifier 600. This correction leads to an output voltage $U_A$ at the output of the operation amplifier 600 which is present as base-emitter voltage at a transistor T1. The collector terminal of transistor T1 is connected to the laser 150 so that the laser 150 is driven by the operational amplifier 600 by means of transistor T1.

Figure 3:
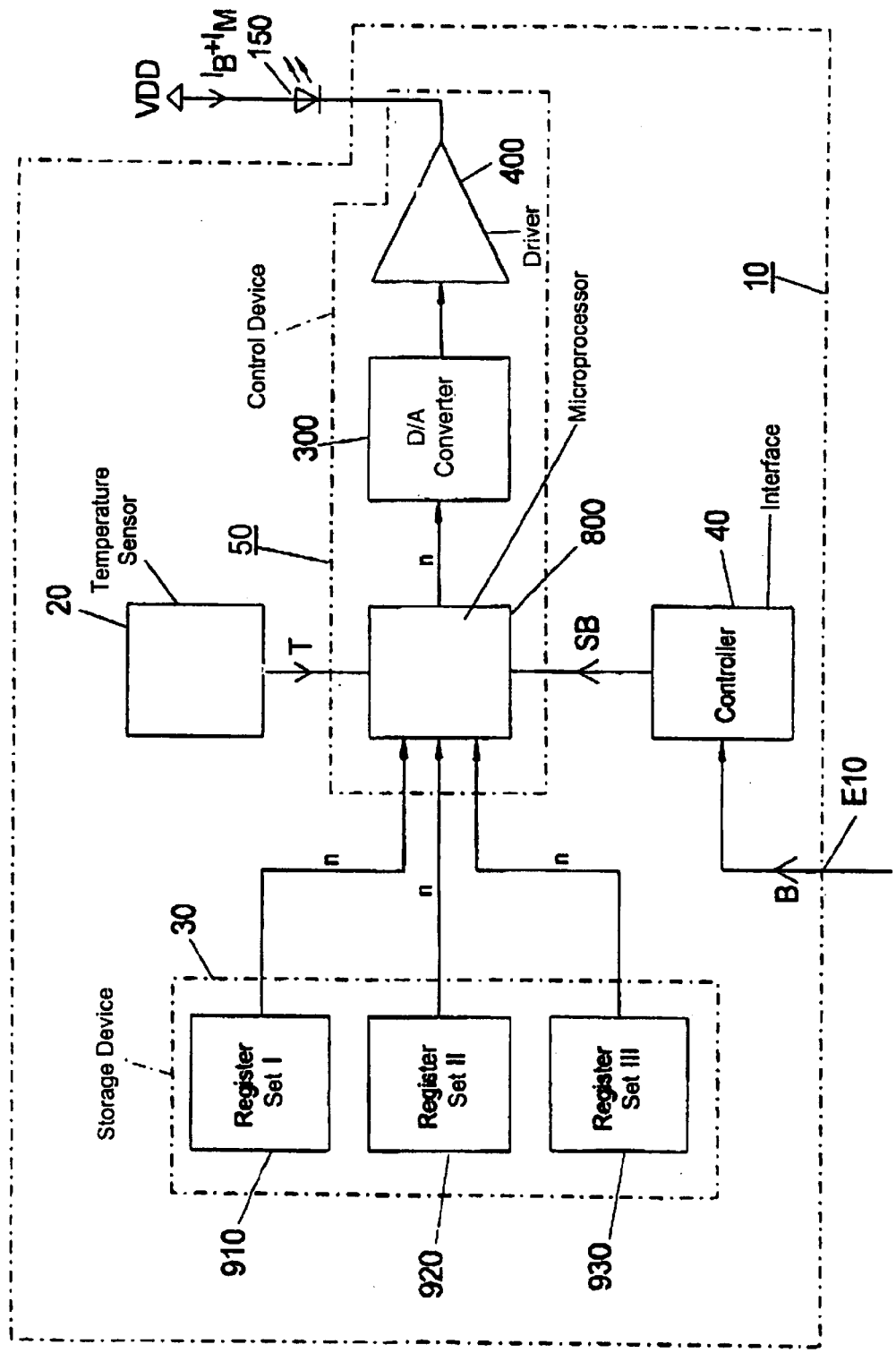
FIG. 3 shows a further exemplary embodiment of a driving device.

The programmable resistor network $R_{Adj}$ can be, for example, a resistor network as described in detail in the patent application No. 10/454,021, particularly in conjunction with FIGS. 3 to 5.

FIG. 3 shows a further exemplary embodiment of a driving device 10. In distinction from the driving device 10 according to FIG. 1, the temperature sensor 20 in the exemplary embodiment of FIG. 3 is connected directly to the control device 50, namely with a microprocessor 800 of the control device 50. This microprocessor 800 replaces the multiplexer 200 as described in conjunction with FIGS. 1 and 2.

Microprocessor 800 has the task of reading out the temperature sensor 20 and correspondingly reading out the storage device 30 depending on the operating mode B predetermined at the interface via interface 40 and depending on the measured temperature value T determined by the temperature sensor 20.

In the storage device 30, the drive tables 900, 910, 920 (designated as registers set I to III in FIG. 3) required for driving the laser 150 are stored.

As soon as the microprocessor has read out the current values $I_B$ and $I_M$, required for driving the laser 150, from the storage device 30, it correspondingly drives the D/A converter 300 in such a manner that the desired current flows through the laser 150.

I claim:

1. A driving device for a light-emitting component, comprising:
   an interface device for inputting a control signal for selecting an operating mode of the light-emitting component; and
   a control device connected to said interface device;
   said control device for, depending on said operating mode that is selected and depending on a temperature present at the light-emitting component or on a temperature proportional to a temperature present at the light-emitting component, driving the light-emitting component with a predetermined operating-mode and a predetermined temperature-dependent bias current and/or with a predetermined operating-mode and a predetermined temperature-dependent modulation current.

2. The driving device according to claim 1, further comprising a temperature sensor for providing a measured temperature value by measuring said temperature of the light-emitting component or said temperature proportional to the temperature of the light-emitting component.

3. The driving device according to claim 1, further comprising:
   a storage device for storing a first drive table for a first operating mode of the light-emitting component and for storing a second drive table for a second operating mode of the light-emitting component;
   said second operating mode being different from said first operating mode;
   said first drive table including a bias current value and/or a modulation current value for at least two temperature values; and
   said second drive table including a bias current value and/or a modulation current value for at least two temperature values.

4. The driving device according to claim 3, wherein:
   said storage device is connected to said control device;
   said control device is designed for reading out said bias current value and/or said modulation current value from said first drive table or said second drive table depending on said operating mode that is selected and depending on said temperature of the light-emitting component or said temperature proportional to the temperature of the light-emitting component; and said control device is designed for driving the light-emitting component with a bias current corresponding to said bias current value from said first drive table or said second drive table and/or with a modulation current corresponding to said modulation current value from said first drive table or said second drive table.

5. The driving device according to claim 3, further comprising:

a temperature sensor connected to said storage device;

said temperature sensor for providing a measured temperature value to said storage device.

6. The driving device according to claim 3, wherein:

said storage device includes a plurality of separate storage areas;

one of said plurality of separate storage areas for storing said first drive table; and one of said plurality of separate storage areas for storing said second drive table.

7. The driving device according to claim 6, wherein each one of said plurality of separate storage areas is formed by a separate memory chip.

8. The driving device according to claim 6, further comprising a temperature sensor connected to each one of said plurality of separate storage areas.

9. The driving device according to claim 6, further comprising:

a temperature sensor connected to said storage device;

said temperature sensor for providing a measured temperature value to said storage device;

each one of said plurality of separate storage areas of said storage device including a plurality of storage locations;

each one of said plurality of separate storage areas of said storage device designed such that said measured temperature value of said temperature sensor specifies a particular one of said plurality of storage locations that can be read out by said control device.

10. The driving device according to claim 1, further comprising:

a temperature sensor for providing a measured temperature value to said control device;

said temperature sensor connected to said control device.

11. The driving device according to claim 1, in combination with the light-emitting component, wherein said control device includes a D/A converter and a driver connected to the light-emitting component.

12. The combination according to claim 11, wherein said driver includes an operational amplifier.

13. The combination according to claim 12, wherein:

said operational amplifier includes a first input; and said D/A, converter is connected to said first input of said operational amplifier.

14. The combination according to claim 13, further comprising:

a programmable resistor network controllable by control signals and/or control bits;

said operational amplifier including a second input connected to said programmable resistor network.

15. The combination according to claim 14, wherein:

the light-emitting component includes a monitor diode; and said programmable resistor network is connected to the monitor diode of the light-emitting component.

16. The combination according to claim 11, further comprising:

a programmable resistor network controllable by control signals and/or control bits;

said driver including an operational amplifier with a negative input and a positive input; and said D/A converter connected to said negative input of said operational amplifier and said programmable resistor network connected to said positive input of said operational amplifier.

17. The driving device according to claim 1, in combination with the light-emitting component, wherein the light-emitting component is a laser.

18. A method for driving a light-emitting component, which comprises:

selecting an operating mode from at least two different stored operating modes for driving the light-emitting component; and depending on the operating mode that is selected and depending on a temperature of the light-emitting component or on a temperature proportional to the temperature of the light-emitting component, driving the light-emitting component with a predetermined operating-mode and a temperature-dependent bias current and/or a predetermined operating-mode and a temperature-dependent modulation current.

19. The method according to claim 18, which further comprises:

obtaining a measured temperature value by measuring the temperature of the light-emitting component or the temperature proportional to the temperature of the light-emitting component; and driving the light-emitting component using the measured temperature value.

20. The method according to claim 19, which further comprises:

depending on the measured temperature value and on the operating mode that is selected, reading out of a drive table, a bias current value for the bias current of the light-emitting current and/or a modulation current value for the modulation current of the light-emitting component; and performing the step of driving the light-emitting component using a bias current corresponding to the bias current value and/or a modulation current corresponding to the modulation current value.

21. The method according to claim 18, which further comprises providing the light-emitting component as a laser.

22. In combination, a light-emitting component and a driving device for the light-emitting component, comprising:

a light-emitting component to be selectively operated in different operating modes; and a driving device connected to said light-emitting component, said driving device having:

an interface device for inputting a control signal for selecting an operating mode of the light-emitting component; and a control device connected to said interface device, said control device, depending on the selected said operating mode and depending on a temperature at said light-emitting component or on a temperature proportional to a temperature at said light-emitting component, driving said light-emitting component with a predetermined operating mode and a predetermined temperature-dependent bias current and/or with a predetermined operating mode and a predetermined temperature-dependent modulation current.

* * * * *

UNITED STATES PATENT AND TRADEMARK OFFICE
CERTIFICATE OF CORRECTION

PATENT NO. : 6,943,505 B2
DATED : September 13, 2005
INVENTOR(S) : Karl Schrödinger It is certified that error appears in the above-identified patent and that said Letters Patent is hereby corrected as shown below:

Column 5,
Lines 43-44, should read as follows:
-- FIG. 2 shows an exemplary embodiment of the driving device according to FIG. 1; --; and Column 6,
Lines 6-7, should read as follows:
-- FIG. 3 shows a further exemplary embodiment of a driving device. --.

Signed and Sealed this

First Day of November, 2005

JON W. DUDAS
*Director of the United States Patent and Trademark Office*